United States Patent
Lin et al.

(10) Patent No.: US 9,753,105 B2
(45) Date of Patent: Sep. 5, 2017

(54) DEBUGGING DEVICE FOR A BODY COIL OF A MAGNETIC RESONANCE IMAGING SYSTEM

(71) Applicants: Hou Quan Lin, Shenzhen (CN); Yu Tang, Shenzhen (CN); JianMin Wang, Shenzhen (CN); Qiu Yi Zhang, Shenzhen (CN)

(72) Inventors: Hou Quan Lin, Shenzhen (CN); Yu Tang, Shenzhen (CN); JianMin Wang, Shenzhen (CN); Qiu Yi Zhang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 643 days.

(21) Appl. No.: 14/229,896

(22) Filed: Mar. 29, 2014

(65) Prior Publication Data

US 2014/0327442 A1 Nov. 6, 2014

(30) Foreign Application Priority Data

Mar. 29, 2013 (CN) .......................... 2013 1 0106536

(51) Int. Cl.
*G01V 3/00* (2006.01)
*G01R 33/36* (2006.01)
*G01R 33/34* (2006.01)

(52) U.S. Cl.
CPC ...... *G01R 33/365* (2013.01); *G01R 33/34046* (2013.01); *G01R 33/3678* (2013.01)

(58) Field of Classification Search
CPC ............. G01R 33/5608; G01R 33/543; G01R 33/3815; G01R 33/5616; A61B 5/055

USPC .......................................................... 324/322
See application file for complete search history.

(56) References Cited

U.S. PATENT DOCUMENTS

| | | | |
|---|---|---|---|
| 5,543,712 A | | 8/1996 | Arakawa et al. |
| 5,621,322 A | * | 4/1997 | Ehnholm ......... G01R 33/34046 324/316 |
| 5,646,530 A | * | 7/1997 | Strenk ................ G01R 33/3415 324/318 |
| 6,249,121 B1 | | 6/2001 | Boskamp et al. |
| 6,437,567 B1 | | 8/2002 | Schenck et al. |

(Continued)

FOREIGN PATENT DOCUMENTS

| | | |
|---|---|---|
| JP | H08252241 A | 10/1996 |
| KR | 20010020841 A | 3/2001 |

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A debugging device for a body coil of a magnetic resonance imaging (MRI) system includes a pair of output ports connected to a pair of input ports of the body coil. The debugging device also includes a pair of input ports connected to a pair of output ports of the MRI system. The debugging device includes a pair of extension circuits, separately connected between the pair of input ports and the pair of output ports; and a first adjustment capacitor for reducing or eliminating coupling between the pair of input ports. The first adjustment capacitor is bridged between the pair of input ports, and the capacitance of the first adjustment capacitor is variable.

11 Claims, 2 Drawing Sheets

(56) References Cited

U.S. PATENT DOCUMENTS

| | | | |
|---|---|---|---|
| 2003/0218514 A1* | 11/2003 | Eckl | H03H 7/0115 333/32 |
| 2009/0160442 A1 | 6/2009 | Mazurkewitz et al. | |
| 2009/0256564 A1* | 10/2009 | Greim | G01R 33/34076 324/309 |
| 2011/0312499 A1* | 12/2011 | Vaughan | A61B 5/055 505/162 |

FOREIGN PATENT DOCUMENTS

| KR | 20010062132 A | 7/2001 |
|---|---|---|
| KR | 20080110772 A | 12/2008 |

\* cited by examiner

DEBUGGING DEVICE FOR A BODY COIL OF A MAGNETIC RESONANCE IMAGING SYSTEM

This application claims the benefit of CN 201310106536.7, filed on Mar. 29, 2013, which is hereby incorporated by reference in its entirety.

TECHNICAL FIELD

The present embodiments relate to a debugging device for a body coil of a magnetic resonance imaging system.

BACKGROUND

Magnetic resonance imaging (MRI) is a technology in which magnetic resonance is utilized for the purpose of imaging. Where an atomic nucleus contains a single proton, as is the case, for example, with the nuclei of the hydrogen atoms that are present throughout the human body, this proton exhibits spin motion and resembles a small magnet. The spin axes of these small magnets lack a definite pattern, and if an external magnetic field is applied, the small magnets will be rearranged according to the magnetic force lines of the external field (e.g., will line up in two directions, either parallel or anti-parallel to the magnetic force lines of the external magnetic field). The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that spin axes deviate from the positive longitudinal axis or negative longitudinal axis, giving rise to resonance (e.g., the phenomenon of magnetic resonance). Once the spin axes of the excited atomic nuclei have deviated from the positive or negative longitudinal axis, the atomic nuclei have a transverse magnetization component. Once emission of the RF pulse has ended, the excited atomic nucleus emits an echo signal, gradually releasing the absorbed energy in the form of electromagnetic waves, such that a phase and energy level both return to the pre-excitation state. An image may be reconstructed by subjecting the echo signal emitted by atomic nuclei to further processing, such as spatial encoding.

A magnetic resonance imaging (MRI) system includes more than one type of coil, such as a body coil that covers the entire body and a local coil that only covers a certain part of the body. Of these, the body coil is used to generate the RF field B1, and may be excited by a pair of input ports of an excitation source that are orthogonal with respect to the system frequency and have the same amplitude. One of the principal aims of body coil debugging is to eliminate coupling between the two ports in this port pair.

To achieve ideal targets, currently used debugging methods are tedious and difficult, and include adjusting the capacitance on the end ring of the body coil, adjusting the mechanical position of the body coil, and a combination of these two methods. Three adjustable capacitors are introduced at three positions on the end ring where the decoupling effect is influenced significantly. The adjustable capacitors may be finely adjusted by having an adjustment rod protrude through the gap between the body coil and the shielding layer. Since the adjustment range of the adjustable capacitors is limited under harsh target requirements such as high voltage, while the distance between the body coil and the shielding layer is very small, the body coil is to be withdrawn and replaced inside the shielding layer repeatedly, and the mechanical position is to be adjusted. This debugging process not only takes time but also increases the likelihood of mechanical wear.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the work of body coil debugging may be moved to the outside of the body coil. A debugging device for a body coil of a magnetic resonance imaging (MRI) system is provided. The debugging device includes a pair of output ports connected to a pair of input ports of the body coil. The debugging device also includes a pair of input ports connected to a pair of output ports of the MRI system. The debugging device includes a pair of extension circuits separately connected between the pair of input ports and the pair of output ports. A first adjustment capacitor, for reducing or eliminating coupling between the pair of input ports, is bridged between the pair of input ports. The capacitance of the first adjustment capacitor is variable.

In one embodiment, the pair of extension circuits includes a pair of first coaxial lines. The pair of first coaxial lines have the same length, and two ends of the first adjustment capacitor are each connected between a different one of the input ports and the first coaxial line connected thereto.

In one embodiment, the pair of extension circuits further include a pair of second coaxial lines separately connected between the pair of first coaxial lines and the pair of output ports. The debugging device further includes a second adjustment capacitor for reducing or eliminating coupling between the pair of input ports. The two ends of the second adjustment capacitor are each connected between a different one of the first coaxial lines and the second coaxial line connected thereto. The pair of second coaxial lines are of the same length, and the capacitance of the second adjustment capacitor is variable.

In one embodiment, the length of the pair of first coaxial lines and the length of the pair of second coaxial lines are such that the adjustment to coupling between the pair of input ports performed by the first adjustment capacitor is orthogonal to the adjustment to coupling between the pair of input ports performed by the second adjustment capacitor.

In one embodiment, the length of the pair of first coaxial lines and the length of the pair of second coaxial lines are fixed.

In one embodiment, the pair of extension circuits includes a pair of series resonant circuits. The pair of series resonant circuits includes a resonant capacitor and a resonant inductor. The resonant capacitor and the resonant inductor resonate at a working frequency of the body coil, and the two ends of the first adjustment capacitor are each connected between the resonant capacitor and the resonant inductor of a different one of the series resonant circuits.

In one embodiment, the capacitances of the resonant capacitors in the pair of resonant capacitors are equal and variable, and the inductances of the resonant inductors in the pair of resonant inductors are equal and variable.

A body coil for an MRI system includes any one of the above debugging devices.

An MRI system includes the body coil described above.

The debugging device for a body coil according to one or more of the present embodiments reduces the debugging time and device loss while achieving the same decoupling effect.

DETAILED DESCRIPTION

The present embodiments are illustrated below in further detail by way of examples, to clarify the object, technical solution and advantages of the embodiments.

A regulating device is provided outside the body coil. This device moves the work of decoupling to the outside of the body coil using an extension circuit, so as to reduce the debugging time while achieving the same decoupling effect.

First Embodiment

Figure 1:
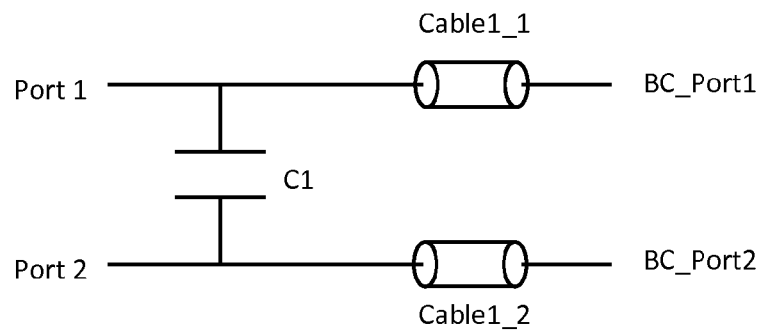
FIG. 1 is a schematic diagram of a debugging device according to a first embodiment.

FIG. 1 is a schematic diagram of one embodiment of a debugging device. As FIG. 1 shows that the debugging device includes a pair of output ports, BC_Port1/BC_Port2, connected to a pair of input ports of the body coil. The debugging device also includes a pair of input ports, Port1/Port2, connected to a pair of output ports of a magnetic resonance imaging (MRI) system. The debugging device includes a pair of first coaxial lines, Cable1_1/Cable1_2. The first coaxial line Cable1_1 is connected between the output port BC_Port1 and the input port Port1, while the first coaxial line Cable1_2 is connected between the output port BC_Port2 and the input port Port2. A first adjustment capacitor C1 is bridged between the pair of input ports Port1/Port2, where the pair of first coaxial lines Cable1_1/Cable1_2 have the same length that is variable. The capacitance of the first adjustment capacitor C1 is variable, and two ends of the first adjustment capacitor C1 are each connected between the corresponding first coaxial line and input port.

The capacitance on a body coil end ring maintains an original balanced distribution. Of the three adjustable capacitors, the two adjustable capacitors that act to regulate frequency are retained, while the other adjustment capacitor, which served to regulate the degree of coupling between input ports, is removed. The debugging device according to the first embodiment, as shown in FIG. 1, is connected to the pair of input ports (e.g., coaxial lines) of the body coil end ring. The debugging device according to the first particular embodiment includes a pair of first coaxial lines, Cable1_1/Cable1_2, where the first coaxial line Cable1_1 is connected between the output port BC_Port1 and the input port Port1, while the first coaxial line Cable1_2 is connected between the output port BC_Port2 and the input port Port2. A first adjustment capacitor C1 is bridged between the pair of input ports Port1/Port2. The pair of first coaxial lines Cable1_1/Cable1_2 have the same length.

Using the pair of first coaxial lines Cable1_1and Cable1_2, the debugging device according to the first embodiment makes the pair of input ports of the body coil end ring (e.g., the pair of output ports BC_Port1/BC_Port2 of the debugging device) equivalent to the pair of input ports Port1/Port2 of the debugging device, and by adjusting the length of the pair of first coaxial lines Cable1_1/Cable1_2 and the capacitance of the first adjustment capacitor C1, brings the transmission coefficient between the pair of input ports Port1 and Port2 as close as possible to 0 (e.g., eliminates coupling between the pair of input ports Port1/Port2). In general, the lengths of the pair of first coaxial lines Cable1_1/Cable1_2 are discrete values, with a comparatively limited range of selection. The capacitances of the first adjustment capacitor C1 are nearly continuous values with a high degree of freedom of adjustment.

In contrast with the prior art, the debugging device according to the first embodiment moves the debugging operation used to eliminate coupling between ports to the outside of the body coil, reducing debugging time and increasing debugging efficiency. The debugging process is thus more convenient. The use of external debugging provides that the state of debugging may be monitored in real time. The debugging device according to the first embodiment has a relatively simple structure that is easy to realize.

Second Embodiment

With the first embodiment, since the coaxial line length is not adjusted continuously, but is one of a number of discrete values, the accuracy of debugging is somewhat inadequate. Since the electrical length from the pair of output ports BC_Port1/BC_Port2 to the pair of input ports Port1/Port2 has become a variable value, in some situations, there will be a conflict between the electrical length from the pair of output ports BC_Port1/BC_Port2 to the pair of input ports Port1/Port2 and other parameters of the MRI system.

Figure 2:
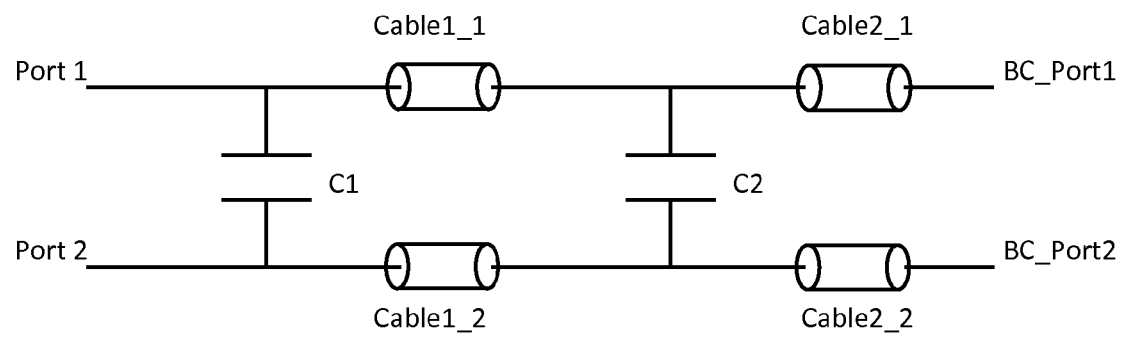
FIG. 2 is a schematic diagram of a debugging device according to a second embodiment.

FIG. 2 is a schematic diagram of one embodiment of a debugging device that is a variation of the debugging device according to the first embodiment. As FIG. 2 shows, the debugging device according to a second embodiment includes a pair of output ports, BC_Port1 and BC_Port2, connected to a pair of input ports of the body coil. The debugging device includes a pair of input ports, Port1 and Port2, connected to a pair of output ports of the MRI system. The debugging device also includes a pair of first coaxial lines, Cable1_1 and Cable1_2, where the first coaxial line Cable1_1 is connected between the output port BC_Port1 and the input port Port1, while the first coaxial line Cable1_2 is connected between the output port BC_Port2 and the input port Port2. A first adjustment capacitor C1 is bridged between the pair of input ports Port1 and Port2. The debugging device also includes a pair of second coaxial lines, Cable2_1 and Cable2_2, where the second coaxial line Cable2_1 is connected between the first coaxial line Cable1_1 and the output port BC_Port1, and the second coaxial line Cable2_2 is connected between the first coaxial line Cable1_2 and the output port BC_Port2. A second adjustment capacitor C2 is bridged between the pair of second coaxial lines Cable2_1/Cable2_2 and the pair of first coaxial lines Cable1_1/Cable1_2 (e.g., two ends of the second adjustment capacitor C2 are connected between the first coaxial line Cable1_1 and second coaxial line Cable2_1, which are connected to each other, and between the first coaxial line Cable1_2 and second coaxial line Cable2_2, which are connected to each other, respectively).

The capacitance on the body coil end ring maintains an original balanced distribution. Of the three adjustable capacitors, the two adjustable capacitors that act to regulate frequency are retained, while the other adjustable capacitor, which served mainly to regulate the degree of coupling between input ports, is removed. The debugging device according to the second embodiment, as shown in FIG. 2, is connected to the pair of input ports (e.g., coaxial lines) of the body coil end ring. The debugging device includes two sections of coaxial line connected to each port and two capacitors bridged between the two sections of coaxial line. The pair of first coaxial lines Cable1_1/Cable1_2 have the same length, and the pair of second coaxial lines Cable2_1/Cable2_2 have the same length.

Using the pair of first coaxial lines Cable1_1/Cable1_2 and the pair of second coaxial lines Cable2_1/Cable2_2, the debugging device according to the second embodiment makes the pair of input ports of the body coil end ring (e.g., the pair of output ports BC_Port1/BC_Port2 of the debugging device) equivalent to the pair of input ports Port1/Port2 of the debugging device. By setting the length of the pair of first coaxial lines Cable1_1/Cable1_2 and the length of the pair of second coaxial lines Cable2_1/Cable2_2, the effect, in terms of adjustment, of the capacitance of the first adjustment capacitor C1 on the transmission coefficient between the pair of input ports Port1 and Port2 is made orthogonal to the effect, in terms of adjustment, of the capacitance of the second adjustment capacitor C2 on the transmission coefficient between the pair of input ports Port1 and Port2. In other words, since the use of coaxial lines will result in the phase of current transmitted on the coaxial lines being changed, the length of the pair of first coaxial lines Cable1_1/Cable1_2 and the length of the pair of second coaxial lines Cable2_1/Cable2_2 are set such that when the capacitance of the first capacitor C1 is adjusted, the result of adjusting the capacitance of the second capacitor C2 will be unaffected, and when the capacitance of the second capacitor C2 is adjusted, the result of adjusting the capacitance of the first capacitor C1 will be unaffected. Thus, by adjusting the first capacitor C1 and the second capacitor C2 separately, the transmission coefficient between the pair of input ports Port1 and Port2 may be brought as close as possible to 0 (e.g., coupling between the pair of input ports Port1/Port2 may be eliminated).

In the debugging device according to the second embodiment, the lengths of the pair of first coaxial lines and the pair of second coaxial lines are fixed. The length may be determined approximately based on experience, or calculated precisely using the basic theory of electromagnetic transmission, such that the effects of the first adjustment capacitor C1 and the second adjustment capacitor C2 on the value (e.g., expressed in the form of a complex number) of the transmission coefficient between the pair of input ports Port1 and Port2 are orthogonal with respect to the target value "zero". On an SMITH chart, this may be represented by the region formed by the range of adjustment thereof being symmetric with respect to the zero point.

In contrast with the prior art, the debugging device according to the second embodiment moves the debugging operation used to eliminate coupling between ports to the outside of the body coil, reducing debugging time and increasing debugging efficiency, and thereby making the debugging process more convenient. The use of external debugging provides that the state of debugging may be monitored in real time.

In contrast with the debugging device according to the first embodiment, the first coaxial lines and second coaxial lines in the debugging device according to the second embodiment are of fixed length, so that adjustment is made only to the first adjustment capacitor and the second adjustment capacitor during debugging. Since the electrical length from the pair of output ports BC_Port1/BC_Port2 to the pair of input ports Port1/Port2 has become a variable value, in some situations, there will be a conflict between the electrical length from the pair of output ports BC_Port1/BC_Port2 to the pair of input ports Port1/Port2 and other parameters of the MRI system.

Third Embodiment

In view of the fact that in the first embodiment, the electrical length from the pair of output ports BC_Port1/BC_Port2 to the pair of input ports Port1/Port2 is a variable value, according to a third embodiment, the coaxial lines connected to the pair of output ports are each replaced by a section of coaxial line of the same fixed length, to which an adjustable series resonant circuit with a relatively low loaded quality factor is then connected in series.

Figure 3:
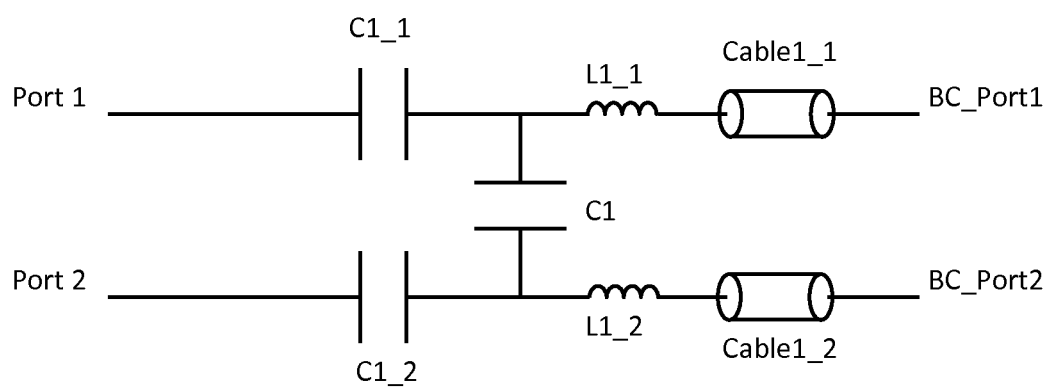
FIG. 3 is a schematic diagram of a debugging device according to a third embodiment.

FIG. 3 is a debugging device according to the third embodiment. As FIG. 3 shows, the debugging device according to the third embodiment further includes a pair of series resonant circuits. A resonant capacitor C1_1 and a resonant inductor L1_1 are connected in series to form a resonant circuit that is connected between a coaxial line Cable1_1 and an input port Port1, while a resonant capacitor C1_2 and a resonant inductor L1_2 are connected in series to form a resonant circuit that is connected between a coaxial line Cable1_2 and an input port Port2. As FIG. 3 shows, the series resonant circuit is symmetric with respect to a center line lying in a direction parallel to the two lines.

The resonant capacitor C1_1 and the resonant capacitor C1_2 are kept equal at all times. During adjustment, the resonant inductor L1_1 and resonant capacitor C1_1, and the resonant inductor L1_2 and resonant capacitor C1_2 keep resonating at the working frequency of the body coil. A first adjustment capacitor C1 is bridged between the pair of resonant capacitors C_1/C1_2 and the pair of resonant inductors L1_1/L1_2 (e.g., the two ends of the first adjustment capacitor C1 are connected between the resonant capacitor C1_1 and resonant inductor L1_1, and between the resonant capacitor C1_2 and resonant inductor L1_2, respectively). When the inductor/capacitor combination forming the resonant circuits is different, the adjustment range of the first adjustment capacitor C1 is different and may reduce or eliminate coupling between the pair of input ports Port1/Port2. In the debugging device according to the third embodiment, the electrical length from the pair of output ports BC_Port1/BC_Port2 to the pair of input ports Port1/Port2 is a variable value feature, where the length of the pair of coaxial lines may be 0.

Laboratory tests have shown that before the adoption of the debugging device according to the second embodiment, for the degree of coupling between the pair of input ports Port1/Port2, the transmission coefficient was −6.9 dB), where after the adoption of the debugging device according to the second embodiment, for the degree of coupling between the pair of input ports Port1/Port2, the transmission coefficient was −17.3 dB. One or more of the present embodiments are capable of greatly reducing or eliminating coupling between a pair of input ports.

The above embodiments are not intended to define the scope of protection. In the course of particular implementation, suitable improvements may be made to the embodiments to suit specific requirements of specific circumstances. Thus, the particular embodiments of the present invention described herein serve a demonstrative function only, and are not intended to limit the scope of protection of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A debugging device for a body coil of a magnetic resonance imaging (MRI) system, the debugging device comprising:
   a pair of output ports connected to a pair of input ports of the body coil;
   a pair of input ports connected to a pair of output ports of the MRI system;
   a pair of extension circuits separately connected between the pair of input ports and the pair of output ports; and
   a first adjustment capacitor operable for reducing or eliminating coupling between the pair of input ports, the first adjustment capacitor being bridged between the pair of input ports, and the capacitance of the first adjustment capacitor being variable;
   wherein the pair of extension circuits further comprise a pair of first coaxial lines, the pair of first coaxial lines having the same length, and two ends of the first adjustment capacitor are each connected between a different one of the input ports and the first coaxial line connected thereto,
   wherein the pair of extension circuits further comprise a pair of second coaxial lines separately connected between the pair of first coaxial lines and the pair of output ports,
   a second adjustment capacitor operable for reducing or eliminating coupling between the pair of input ports, two ends of the second adjustment capacitor each being connected between a different one of the first coaxial lines and the second coaxial line connected thereto,
   wherein the pair of second coaxial lines are of the same length, and the capacitance of the second adjustment capacitor is variable, and
   wherein the length of the pair of first coaxial lines and the length of the pair of second coaxial lines are such that adjustment to coupling between the pair of input ports performed by the first adjustment capacitor effects the transmission coefficient between the pair of input ports orthogonally to adjustment to coupling between the pair of input ports performed by the second adjustment capacitor,
   wherein the debugging device moves the debugging operation of decoupling outside of the body coil.

2. The debugging device of claim 1, wherein the length of the pair of first coaxial lines and the length of the pair of second coaxial lines are fixed.

3. The debugging device of claim 1, wherein the pair of extension circuits comprises a pair of series resonant circuits, wherein the pair of series resonant circuits comprises a resonant capacitor and a resonant inductor, the resonant capacitor and the resonant inductor resonating at a working frequency of the body coil, and two ends of the first adjustment capacitor each being connected between the resonant capacitor and the resonant inductor of a different one of the series resonant circuits.

4. The debugging device of claim 3, wherein the capacitances of the resonant capacitors in the pair of resonant capacitors are equal and variable, and the inductances of the resonant inductors in the pair of resonant inductors are equal and variable.

5. A body coil for a magnetic resonance imaging (MRI) system, the body coil comprising:
   a debugging device comprising:
      a pair of output ports connected to a pair of input ports of the body coil;
      a pair of input ports connected to a pair of output ports of the MRI system;
      a pair of extension circuits separately connected between the pair of input ports and the pair of output ports; and
      a first adjustment capacitor operable for reducing or eliminating coupling between the pair of input ports, the first adjustment capacitor being bridged between the pair of input ports, and the capacitance of the first adjustment capacitor being variable,
   wherein the pair of first coaxial lines have the same length, and two ends of the first adjustment capacitor are each connected between a different one of the input ports and the first coaxial line connected thereto,
   wherein the pair of extension circuits further comprises a pair of second coaxial lines, separately connected between the pair of first coaxial lines and the pair of output ports,
   wherein the debugging device further comprises a second adjustment capacitor operable for reducing or eliminating coupling between the pair of input ports, two ends of the second adjustment capacitor each being connected between a different one of the first coaxial lines and the second coaxial line connected thereto,
   wherein the pair of second coaxial lines are of the same length, and the capacitance of the second adjustment capacitor is variable,
   wherein the length of the pair of first coaxial lines and the length of the pair of second coaxial lines are such that adjustment to coupling between the pair of input ports performed by the first adjustment capacitor effects the transmission coefficient between the pair of input ports orthogonally to adjustment to coupling between the pair of input ports performed by the second adjustment capacitor,
   wherein the debugging device moves the debugging operation of decoupling outside of the body coil.

6. The body coil of claim 5, wherein the length of the pair of first coaxial lines and the length of the pair of second coaxial lines are fixed.

7. The body coil of claim 5, wherein the pair of extension circuits comprises a pair of series resonant circuits, wherein the pair of series resonant circuits comprises a resonant capacitor and a resonant inductor, the resonant capacitor and the resonant inductor resonating at a working frequency of the body coil, and two ends of the first adjustment capacitor each being connected between the resonant capacitor and the resonant inductor of a different one of the series resonant circuits.

8. The body coil of claim 7, wherein the capacitances of the resonant capacitors in the pair of resonant capacitors are equal and variable, and the inductances of the resonant inductors in the pair of resonant inductors are equal and variable.

9. A magnetic resonance imaging (MRI) system comprising:
   a body coil comprising:
     a debugging device comprising:
       a pair of output ports connected to a pair of input ports of the body coil;
       a pair of input ports connected to a pair of output ports of the MRI system;
       a pair of extension circuits separately connected between the pair of input ports and the pair of output ports; and
       a first adjustment capacitor operable for reducing or eliminating coupling between the pair of input ports, the first adjustment capacitor being bridged between the pair of input ports, and the capacitance of the first adjustment capacitor being variable,
     wherein the pair of extension circuits comprises a pair of first coaxial lines,
     wherein the pair of first coaxial lines have the same length, and two ends of the first adjustment capacitor are each connected between a different one of the input ports and the first coaxial line connected thereto,
     wherein the pair of extension circuits further comprises a pair of second coaxial lines, separately connected between the pair of first coaxial lines and the pair of output ports,
     wherein the debugging device further comprises a second adjustment capacitor operable for reducing or eliminating coupling between the pair of input ports, two ends of the second adjustment capacitor each being connected between a different one of the first coaxial lines and the second coaxial line connected thereto,
     wherein the pair of second coaxial lines are of the same length, and the capacitance of the second adjustment capacitor is variable,
     wherein the length of the pair of first coaxial lines and the length of the pair of second coaxial lines are such that adjustment to coupling between the pair of input ports performed by the first adjustment capacitor effects the transmission coefficient between the pair of input ports orthogonally to adjustment to coupling between the pair of input ports performed by the second adjustment capacitor,
     wherein the debugging device moves the debugging operation of decoupling outside of the body coil.

10. The MRI system of claim 9, wherein the length of the pair of first coaxial lines and the length of the pair of second coaxial lines are fixed.

11. The MRI system of claim 9, wherein the pair of extension circuits comprises a pair of series resonant circuits, wherein the pair of series resonant circuits comprises a resonant capacitor and a resonant inductor, the resonant capacitor and the resonant inductor resonating at a working frequency of the body coil, and two ends of the first adjustment capacitor each being connected between the resonant capacitor and the resonant inductor of a different one of the series resonant circuits.

* * * * *